United States Patent [19]

Iguchi et al.

[11] Patent Number: 5,294,381

[45] Date of Patent: Mar. 15, 1994

[54] METHOD OF MANUFACTURING A DIAMOND HEAT SINK

[75] Inventors: Takahisa Iguchi; Tsutomu Nakamura; Tetsuo Nakai, all of Hyogo, Japan

[73] Assignee: Sumitomo Electric Industries, Ltd., Osaka, Japan

[21] Appl. No.: 964,390

[22] Filed: Oct. 29, 1992

[30] Foreign Application Priority Data

Oct. 21, 1991 [JP] Japan .................. 3-272830

[51] Int. Cl.$^5$ .................. H01L 21/302
[52] U.S. Cl. .................. 264/25; 264/81; 264/129; 264/134; 264/157; 427/250; 427/289; 427/290
[58] Field of Search .................. 264/22, 25, 81, 154, 264/157, 160, 129, 134; 437/225, 226, 228, 902, 946; 427/250, 289, 290, 307

[56] References Cited

U.S. PATENT DOCUMENTS

| | | | |
|---|---|---|---|
| 4,355,457 | 10/1982 | Bartlett et al. | 437/226 |
| 4,981,818 | 1/1991 | Anthony et al. | 437/233 |
| 5,151,389 | 9/1992 | Zappella | 437/226 |
| 5,169,676 | 12/1992 | Moran et al. | 427/122 |
| 5,183,529 | 2/1993 | Potter et al. | 437/946 |
| 5,185,295 | 2/1993 | Goto et al. | 437/226 |

FOREIGN PATENT DOCUMENTS

| | | |
|---|---|---|
| 0142282 | 5/1985 | European Pat. Off. . |
| 57-060861 | 4/1982 | Japan . |
| 60-127750 | 7/1985 | Japan . |
| 2-268917 | 11/1990 | Japan . |
| 3-138106 | 6/1991 | Japan . |

*Primary Examiner*—Jan H. Silbaugh
*Assistant Examiner*—Christopher A. Fiorilla
*Attorney, Agent, or Firm*—W. G. Fasse; W. F. Fasse

[57] ABSTRACT

A polycrystalline diamond is prepared by chemical vapor deposition (step 101). A surface of the polycrystalline diamond is metallized (step 102). The metallized surface of the polycrystalline diamond is grooved with a YAG laser (step 103). A wedge or the like is driven into the grooves of the polycrystalline diamond to pressurize the same, whereby the polycrystalline diamond is divided along the grooves (step 104). Alternatively, a surface of a polycrystalline diamond prepared by chemical vapor deposition is grooved with a YAG laser (step 112), so that the surface of the polycrystalline diamond is metallized (step 113) after the grooving.

10 Claims, 5 Drawing Sheets

METHOD OF MANUFACTURING A DIAMOND HEAT SINK

BACKGROUND OF THE INVENTION

Field of the Invention

The present invention relates to a method of manufacturing a diamond heat sink. More particularly, a diamond heat sink it is produced to contain diamond made by chemical vapor deposition.

Background Information

A heat sink (radiator) is adapted to efficiently dissipate heat which is generated in operation of a device such as a semiconductor laser diode, an LED (light emitting diode), a semiconductor high frequency device or the like. The material for such a heat sink is selected in accordance with the heat produced by the device to which the heat sink is applied. Table 1 shows physical properties of various heat sink materials.

TABLE 1

| Physical Properties | Mono-crystalline Diamond | Vapor-Deposited Diamond | cBN Sintered Body | Cu | Sic | Cu-W | BeO | AlN | Si |
|---|---|---|---|---|---|---|---|---|---|
| Density (g/cm$^2$) | 3.52 | 3.52 | 3.49 | 8.9 | 3.1 | 16.4 | 2.9 | 3.26 | 2.3 |
| Vickers Hardness (kg/mm$^2$) | 12,000 | 12,000 | 6,000 | 80 | — | 260 | 1,200 | 1,200 | — |
| Transverse Rapture Strength (kg/mm$^3$) | 400 | 200 | — | — | 40 | 136 | 20 | 30 | — |
| Thermal Conductivity (W/m · K) | 2,000 | 1,000 | 600 | 390 | 270 | 250 | 250 | 200 | 140 |
| Thermal Expansion Coefficient ($\times 10^{-6}/°C$.) | 2.3 | — | 3.7 | 16.5 | 3.7 | 8.5 | 7.6 | 4.5 | 4.2 |
| Specific Heat (cal/g · °C.) | 0.122 | — | — | 0.092 | — | 0.044 | 0.25 | 0.16 | 0.18 |
| Electric Resistivity ($\Omega \cdot cm$) | $10^{16}$ | $5 \times 10^9$ | $10^{11}$ | $1.7 \times 10^{-6}$ | $10^{13}$ | $3.4 \times 10^{-6}$ | $10^{15}$ | $10^{13}$ | $2.3 \times 10^5$ |
| Dielectric Constant (1 MH$_2$) | 5.7 | 6.5 | 6.5 | — | 40 | — | 6.7 | 8.9 | — |

As shown in Table 1, diamond has a high thermal conductivity. Therefore, a diamond heat sink is employed as a heat dissipating part for a device having a high heating value such as high power semiconductor lasers for communication, optical memories, solid state laser pumping devices or the like, for example. Presently, such a diamond heat sink is mainly made of natural or synthetic monocrystalline diamond.

FIG. 7 is a process diagram successively showing steps in conventional methods of manufacturing diamond heat sinks. Referring to FIG. 7, a monocrystalline diamond material is prepared by high pressure synthesis or the like (step 601). According to a first manufacturing method, this monocrystalline diamond material is cut into chips with a diamond saw (step 610). The cut diamond chips are arranged side by side with no clearances and metallized (step 611), so that only upper and bottom surfaces of each diamond chip are metallized.

According to a second manufacturing method, on the other hand, a monocrystalline diamond material is cut into chips with a diamond saw (step 610), similarly to the first manufacturing method. Each of the cut diamond chips is metallized on all faces (step 612). Side surfaces of the entirely metallized diamond chip are ground with a diamond grindstone (step 613), so that metallized films are left only on upper and bottom surfaces of the diamond chip.

According to a third manufacturing method, a monocrystalline diamond material is metallized before cutting (step 620). The metallized monocrystalline diamond material is cut with a diamond saw into chips, each of which is then cut into a final shape (step 621).

Conventional diamond heat sinks are manufactured in the above manners.

In each of the aforementioned conventional methods of manufacturing diamond heat sinks, a monocrystalline material is cut with a diamond saw. Therefore, the diamond material cannot be cut with a high accuracy, and the cutting speed is very slow. Further, a great deal of waste results from the cutting and grinding steps, leading to an inferior yield. Thus, a diamond heat sink cannot be easily manufactured by a conventional method, leading to inferiority in mass productivity.

On the other hand, each of Japanese Patent Laying-Open Nos. 2-268917 (1990) and 3-138106 (1991) discloses a method of working a monocrystalline diamond material without using a diamond saw.

SUMMARY OF THE INVENTION

It is an object of the present invention to provide a method of manufacturing a diamond heat sink, which can easily work a diamond material with an excellent yield while providing a high mass productivity.

Another object of the present invention is to provide a diamond heat sink which is insulated between the upper and the bottom faces.

In order to attain the aforementioned first object, the method of the invention is adapted to manufacturing a diamond heat sink containing diamond which is synthesized by chemical vapor deposition and having a pair of opposing main surfaces which are electrically insulated from each other. This method includes a step of preparing a polycrystalline diamond, a step of forming grooves in surfaces of the polycrystalline diamond, and a step of mechanically dividing the polycrystalline diamond along the grooves.

According to the present method of manufacturing a diamond heat sink, it is possible to simultaneously divide the polycrystalline diamond along the grooves into many sections. Thus, the diamond material can be easily worked in a shorter time. Further, cut margins result only from the grooves, whereby the yield is improved. Thus, the manufacturing costs are reduced by a reduction of the working time and by an improvement of the yield.

Preferably, the step of forming grooves is carried out with a YAG (yttrium aluminum garnet) laser. Due to such employment of the laser, it is possible to accurately and efficiently work the diamond material.

In order to attain the aforementioned second object, the diamond heat sink according to the present invention contains polycrystalline diamond which is synthesized by vapor deposition and has a pair of opposing main surfaces which are electrically insulated from each other. The diamond heat sink includes first and second graphite layers between the pair of main surfaces. Graphite adheres to the outer peripheral surface of the first layer and the outer peripheral surface of the second layer has a greater surface roughness than that of the first layer.

If the diamond heat sink includes only the first layer, graphite will remain, so that insulation can not be obtained between the two main surfaces. The diamond heat sink according to the present invention obtained by forming a groove to divide the polycrystalline diamond along the groove inevitably has a second layer to which graphite does not adhere and then, the insulation between the two main surfaces can be maintained.

Preferably, a defect, such as chipping, in an edge of the second layer is not more than 50 $\mu$m in size.

In general, such an edge is used as the basis for locating a soldering for a laser diode chip or the like. When a large defect exceeding 50 $\mu$m is caused in this edge, it is difficult to locate the laser diode chip or the like. Further, such a large defect leads to a reduction in the heat dissipating property.

Preferably, the electric resistance along the direction of thickness of the second layer is at least $10 \times 10^6$ $\Omega$.

In general, a semiconductor laser requires an electric resistance of $1 \times 10^6$ $\Omega$, and characteristics of the semiconductor laser deteriorate when the resistance is less than the above value.

Preferably, the electric resistance across the pair of main surfaces of the diamond heat sink is $1 \times 10^6$ $\Omega$.

Preferably, the second layer has a thickness of at least 0.03 mm and not more than 0.3 mm. In order to an attain electric resistance of at least $1 \times 10^6$ $\Omega$ along the direction of thickness of the second layer, it is necessary to make its thickness at least 0.03 mm. As the thickness of the second layer is increased, however, a defect in the edge is easily caused in the second layer when the diamond is divided and also such a defective portion is increased in size. In order to keeps the defective portion which is caused in an edge of the second layer, to not more than 50 $\mu$m in size, it is necessary to make the thickness of the second layer not more than 0.3 mm.

Preferably, the polycrystalline diamond has an electric resistivity of $10^9$ $\Omega$.cm. Such, an electric resistivity of at least $10^9$ $\Omega$.cm is at least necessary for attaining an electric resistance of at least $1 \times 10^6$ $\Omega$ along the direction of thickness of the second layer.

Preferably, the polycrystalline diamond has a thermal conductivity of at least 5 W/cm.K and not more than 20 W/cm.K at room temperature. Due to restrictions set by a conventional apparatus and by the method for preparing polycrystalline diamond, the upper limit of the thermal conductivity of diamond is 20 W/cm.K. In order to apply diamond which provides a performance as a heat sink, the lower limit of its thermal conductivity is preferably at least 5 W/cm.K.

The polycrystalline diamond which is synthesized by chemical vapor deposition preferably has a thermal conductivity of at least 5 W/cm.K in a temperature range from room temperature to 200° C. Further, the grain diameter of the polycrystalline diamond is preferably not more than 50 $\mu$m, so that substantially fewer defects are caused when the polycrystalline diamond is divided.

Preferably, the diamond heat sink includes a metallized film, which is formed at least on all or a portion of at least one of the pair of main surfaces. This metallized film is required for soldering a laser diode chip, as well as for soldering the heat sink itself to a stem.

Preferably, the metallized film includes a first film which is formed on at least one of the pair of main surfaces and a second film which is formed on the surface of the first film.

Preferably, the first film included in the metallized film is made of at least one element selected from a group of Ti, Cr, W and Ni, while the second film is made of at least one element selected from a group of Pt, Pd, Ni, Mo, Au, Ag, Cu, Sn, In, Ge and Pb.

The first film is adapted to react with the diamond to improve adhesion. A metal material for serving such a function of the first film is selected from at least one element selected from a group of Ti, Cr, W and Ni. The second film is adapted to a low contribute to heat resistance and solderbility. A metal material for serving such a function of the second film is prepared from at least one element selected from a group of Pt, Pd, Ni, Mo, Au, Ag, Cu, Sn, In, Ge and Pb.

The completed heat sink has standard dimensions of at least 0.1 mm and not more than 1 mm in thickness and at least 0.2 mm and not more than 50 mm in length and width.

A polycrystalline diamond is employed in the diamond heat sink of the invention and in the present method of manufacturing the same, to avoid the following problems that are caused if a monocrystalline diamond is employed. A polycrystalline diamond has a transverse rapture strength of 200 kg/mm$^2$, while a monocrystalline diamond has a higher transverse rapture strength of 400 kg/mm$^2$, whereby it becomes difficult to divide a monocrystaline diamond. On the other hand, a polycrystalline diamond is broken mainly along grain boundaries, while a monocrystalline diamond is cleaved along the (111) plane. Therefore, the monocrystalline diamond is easier to crack, which, however, leads to a large defect. Thus, the yield is reduced. Further, a polycrystalline diamond provides a material having a large surface area, while a monocrystalline diamond attains an area of about 5 mm by 5 mm at the mot. Thus, the monocrystalline diamond is inferior in productivity.

As hereinabove described, a monocrystalline diamond has various problems. Therefore, a polycrystalline diamond is employed in the present method of manufacturing such diamond heat sinks.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2A:
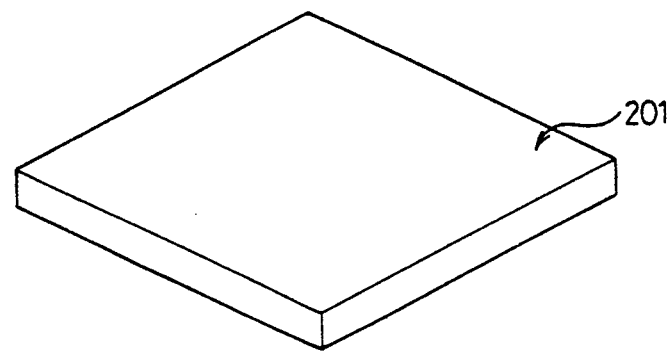
FIGS. 2(a) to 2(c) are perspective views showing the steps of manufacturing a diamond heat sink according to the present invention.
Figure 2B:
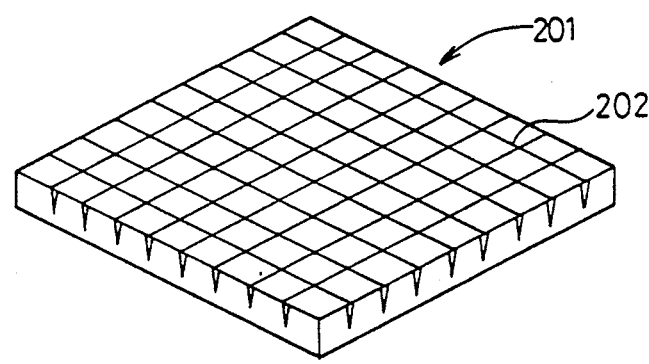
Figure 2C:
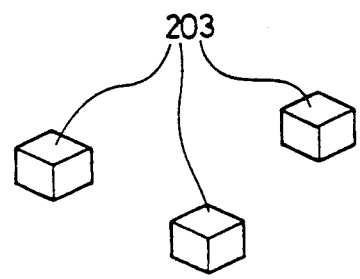

With reference to FIGS. 1(a) and 2(a) to 2(c), a first process of manufacturing diamond heat sinks will now described. First, a polycrystalline diamond 201 is produced by chemical vapor deposition (step 101). Referring to FIG. 2(a), the polycrystalline diamond 201 is metallized, so that a metallized film is formed over the entire surface of the polycrystalline diamond 201 (step 102). Referring to FIG. 2(b), the metallized polycrystalline diamond 201 is grooved with a laser, so that grooves 202 are vertically and horizontally formed on the upper surface of the polycrystalline diamond 201 (step 103). Referring to FIG. 2(c), the grooved polycrystalline diamond 201 is mechanically divided along the grooves 202, thereby forming simultaneously a plurality of diamond heat sinks 203 (step 104).

Referring again to FIGS. 1(a) and 2(a) to 2(c), a second process of manufacturing diamond heat sinks is now described. Referring to FIG. 2(a), a polycrystalline diamond 201 is prepared by chemical vapor deposition (step 101). Referring to FIG. 2(b), this polycrystalline diamond 201 is grooved with a laser, so that grooves 202 are vertically and horizontally formed on the upper surface of the polycrystalline diamond 201 (step 112). The grooved polycrystalline diamond 201 is metallized, so that a metallized film is formed over the entire surface of the polycrystalline diamond 201 (step 113). Referring to FIG. 2(c), the metallized polycrystalline diamond 201 is mechanically divided along the grooves 202, thereby forming simultaneously a plurality of diamond heat sinks 203 (step 104).

The structure of a diamond heat sink manufactured by the aforementioned method will now described.

Figure 1A:
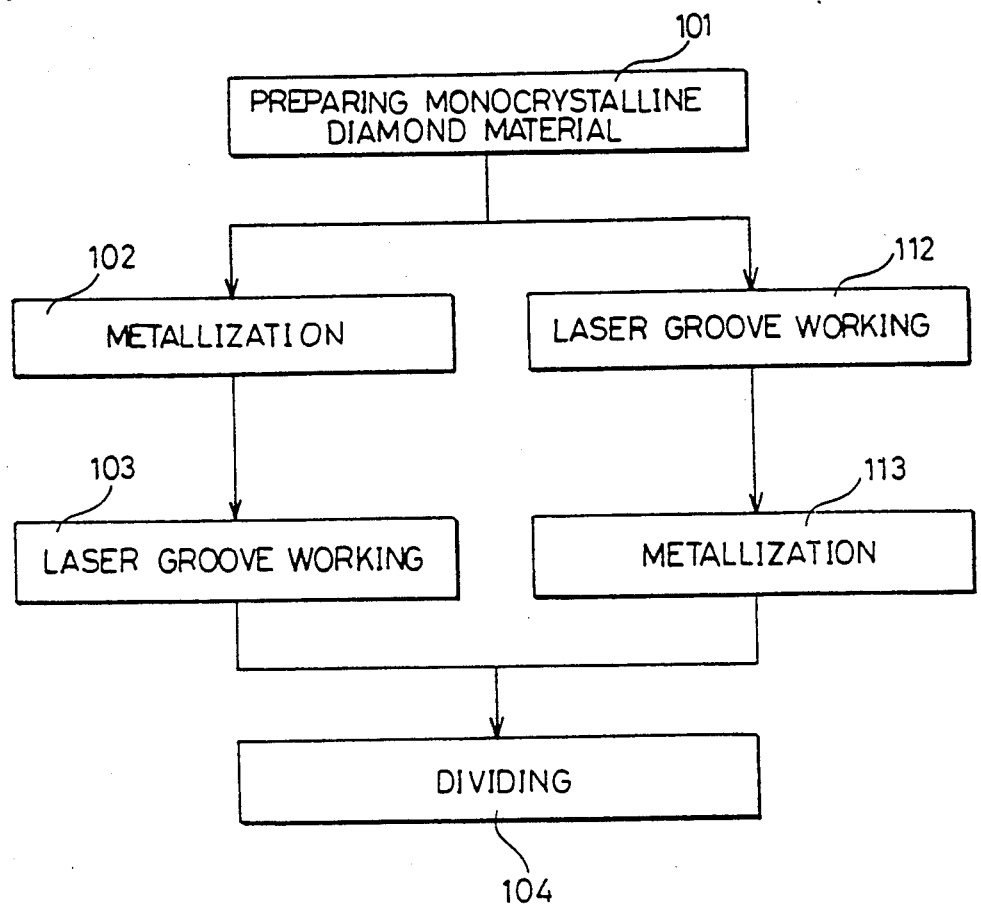
FIG. 1(a) is a process diagram schematically showing a method of manufacturing a diamond heat sink according to the present invention.
Figure 1B:
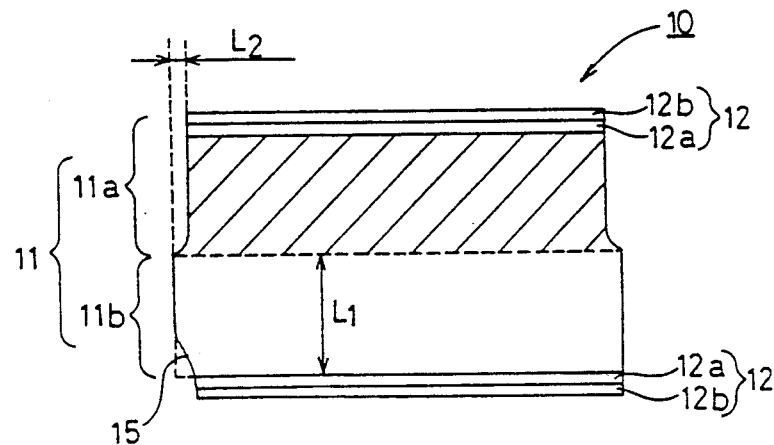
FIG. 1(b) is a side elevational view schematically showing the structure of the diamond heat, sink which is manufactured according to the method of the invention.
Figure 3:
FIG. 3 illustrates the structure of a diamond heat sink according to the present invention.

Referring to FIGS. 1(b) and 3, a diamond heat sink 10 includes a polycrystalline diamond 11 and metallized films 12. The polycrystalline diamond 11 has a first layer 11a which is grooved with a laser and a mechanically divided second layer 11b. The first layer 11a is heated when the same is worked with the laser, whereby graphite is generated around its outer peripheral surface to adhere to the same. On the other hand, the second layer 11b is mainly composed of columnar crystals, due to the preparation by vapor deposition. Upon mechanical division, therefore, the polycrystalline diamond 11 is parted by cleavage along (111) planes of the crystals and by rupture along grain boundaries. Thus, the outer peripheral surface of the second layer 11b is larger in surface roughness than that of the first layer 11a. In more concrete terms, the first and second layers 11a and 11b have a surface roughness of about 5 $\mu$m and 10 $\mu$m, respectively.

The second layer 11a has a thickness $L_1$ in a range of at least 0.03 mm and not more than 0.3 mm. On the other hand, the portion grooved with the laser has a thickness $L_2$ in a range of at least 5 $\mu$m and not more than 20 $\mu$m.

An edge of the second layer 11b may be chipped by the mechanical division, to cause a defective portion 15. The present method assures that the defective portion 15 has a size of not more than 50 $\mu$m.

Each of the metallized films 12 is preferably formed by a plurality of films including a first film 12a and a second film 12b.

The first film 12a is made of at least one element selected from Ti, Cr, W and Ni as an element film, an alloy film or a multilayer film of the same.

The second film 12b is made of at least one element selected from Pt, Pd, Ni, Mo, Au, Ag, Cu, Sn, In, Ge and Pb as an element film, an alloy film or a multilayer film of the same.

FIG. 3 is a side elevational view showing a polycrystalline diamond which is grooved with a laser and thereafter mechanically divided. This polycrystalline diamond is not yet metallized on the side faces.

Figure 4:
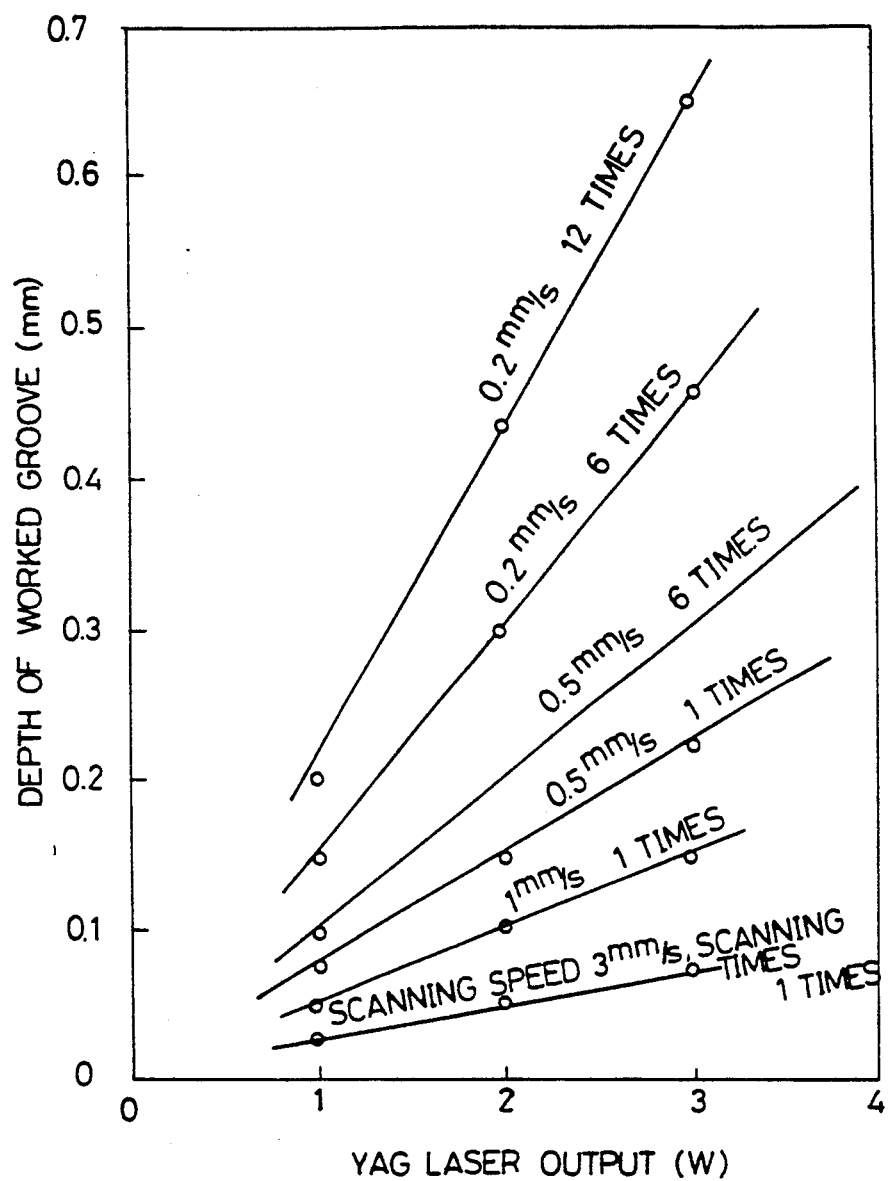
FIG. 4 is a graph showing the depths of cut grooves as a function of the output power of the laser beam used for machining the grooves under the shown conditions for a polycrystalline diamond which is synthesized by hot filament CVD.

Relations between the laser beam machining conditions employed for manufacturing the diamond heat sink and the depths of the worked grooves to FIG. 4. The depths of the cut grooves are increased as the scanning speed is reduced or the number of scanning times is increased under the same laser outputs. The just described relationships between the laser beam machining conditions and the depths of the cut grooves as just described with reference to FIG. 4 for a polycrystalline diamond which is synthesized by a hot filament method are similar for a monocrystalline diamond which is synthesized by high pressure synthesis.

An example of the present method of manufacturing a diamond heat sink will not be described. First, a polycrystalline diamond was synthesized by microwave plasma CVD. The diamond dimensions were: 25.4 mm by 25.4 mm with a thickness of 0.3 mm. This polycrystalline diamond was finished a thickness of 0.25 mm by grinding. The surfaces of the as-ground polycrystalline diamond were metallized by vapor-depositing T, Pt and Au in this order, to a thicknesses of 600 Å, 800 Å and 1000 Å respectively. One of the metallized surfaces of the polycrystalline diamond was grooved with a YAG laser to form a lattice with pitches of 0.77 mm. The polycrystalline diamond was cut or grooved at an output 3 W, a Q-switching frequency of 3 KHz and a scanning speed of 1 mm/s by scanning but once. The as-formed grooves were 0.15 mm in depth.

Then, a wedge of stainless steel was driven into the grooves of the polycrystalline diamond, to pressurize the same. Due to such pressurization, the polycrystalline diamond was easily cut along the to simultaneously form a plurality of heat sinks.

With the aforementioned process polycrystalline diamond heat sinks were obtained whereby each had a dimension of 0.75 mm by 0.75 mm with a thickness of 0.25 mm, having upper and bottom surfaces covered with Ti-Pt-Au metallized films. In the process of manufacturing such polycrystalline diamond heat sinks, the maximum size of defective portions which were caused in edges of the heat sinks was 30 $\mu$m, while the working yield was 100%. The electric resistance across the upper and lower metallized films of each diamond heat sink was $5 \times 10^8$ $\Omega$. The polycrystalline diamond employed in this Example had a specific resistance of $5 \times 10^9$ $\Omega$.cm, and a thermal conductivity of 15 w/cm.K at a temperature of 25° C.

The structure of a diamond heat sink completed by the aforementioned method will now be described.

Figure 5:
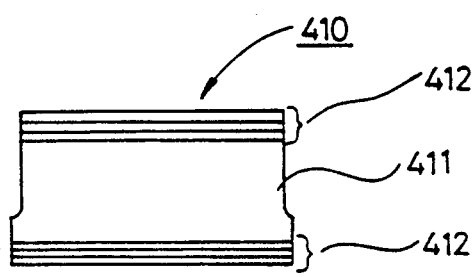
FIG. 5 is a side elevational view schematically showing the structure of a diamond heat sink according to an Example of the present invention.

Referring to FIG. 5, a diamond heat sink 410 is formed by a polycrystalline diamond 411 and metallized films 412 which are formed on upper and bottom main surfaces of the polycrystalline diamond 411. Each of the metallized films 412 is made of Ti, Pt and Au in this order on a main surface of the polycrystalline diamond 411, whereby a diamond heat sink according to Example of the present invention has been formed.

On the other hand, a material of 0.25 mm in thickness was prepared from a monocrystalline diamond which was synthesized by high pressure synthesis. This monocrystalline diamond was metallized and worked with a laser under the same conditions as the above. As the result, grooves of 0.15 mm in depth were formed similarly to the case of the polycrystalline diamond. However, this monocrystalline diamond was easy to crack with defective portions of at least 100 $\mu$m and hard to cut, with an inferior working yield of 10%.

Another Example of the present method of manufacturing a diamond heat sink will now be described.

A polycrystalline diamond was synthesized by a hot filament method, in dimensions of 50.8 mm by 50.8 mm with a thickness of 0.8 mm. This polycrystalline diamond was finished a thickness of 0.635 mm by grinding. Upper and lower surfaces of the so ground polycrystalline diamond were grooved with a YAG laser. Thus, grooves were formed in the upper and bottom surfaces of the polycrystalline diamond with pitches of 2.1 mm, at a laser output of 2.5 W, a Q-switching frequency of 3 KHz and a working speed of 0.5 mm/s by six scanning times. The upper and botttom grooves were displaced by 10 $\mu$m from each other, with depths of 0.25 mm from the upper and bottom surfaces respectively.

The upper and bottom surfaces of the grooved polycrystalline diamond were metallized with Ti, Mo, Ni and Au in this order by sputtering, in thicknesses of 600 Å, 800 Å, 1000 Å and 5000 Å respectively. Then, either one of the metallized upper and bottom surfaces of the polycrystalline diamond was covered with a metallized film of an Au/Sn eutectic alloy by physical vapor deposition. The thickness of the metallized film of the Au/Sn eutectic alloy was 3 $\mu$m.

A lattice-shaped metal jig, which was prepared in accordance with the shapes of the grooves, was introduced into the grooves of the metallized polycrystalline diamond, to pressurize the same. Due to such pressurization, the polycrystalline diamond was easily cut along the grooves, to obtain simultaneously a plurality of polycrystalline diamond heat sinks.

The electric resistance across the upper and bottom metallized films of each diamond heat sink was $1 \times 10^7$ $\Omega$. The maximum size of defective portions which were caused in the edges of the diamond heat sinks was 20 $\mu$m. The polycrystalline diamond employed in this Example had an electric resistivity resistance of $2 \times 10^9$ $\Omega$.cm and a thermal conductivity of 10 W/cm.K at a temperature of 100° C.

The structure of a diamond heat sink completed in the aforementioned manufacturing method will now be described.

Figure 6:
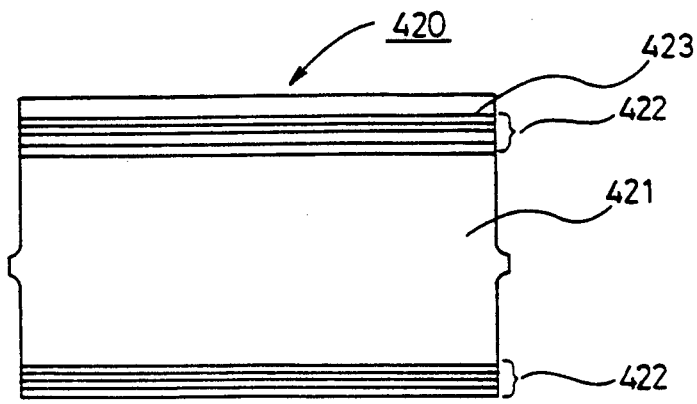
FIG. 6 is a side elevational view schematically showing the structure of a diamond heat sink according to another Example of the present invention.
Figure 7:
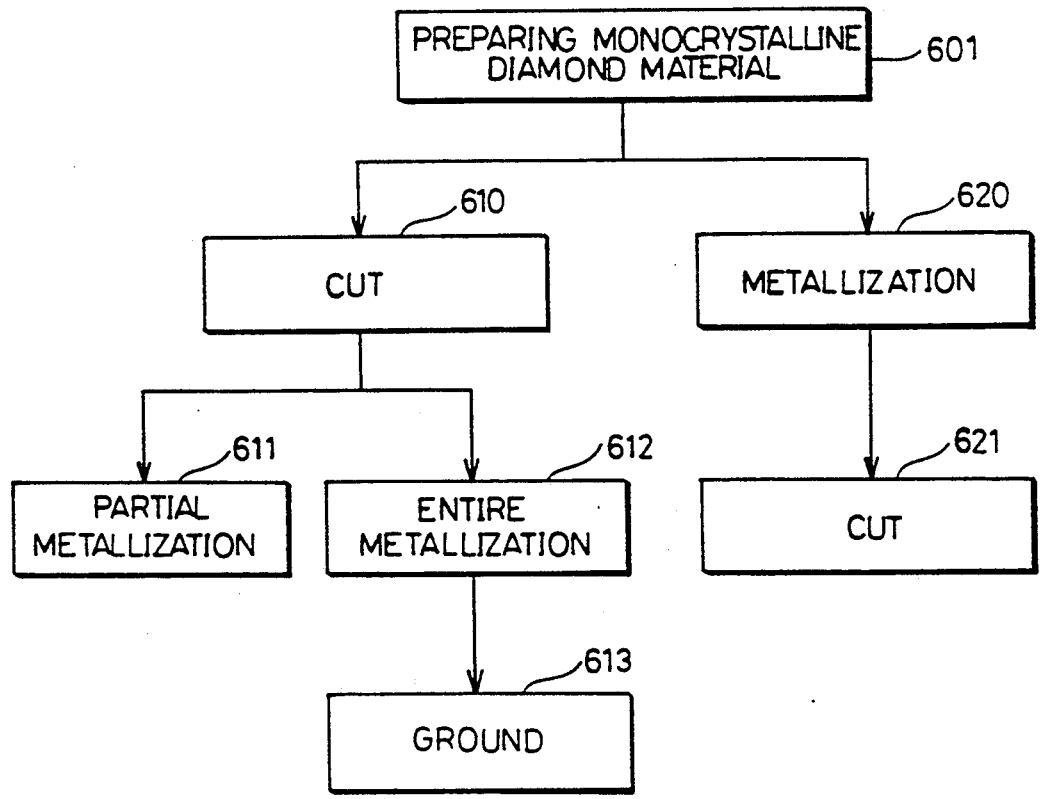
FIG. 7 is a process diagram schematically showing a conventional method of manufacturing a diamond heat sink.

Referring to FIG. 6, a diamond heat sink 420 is formed by a polycrystalline diamond 421, metallized films 422 and a metallized film 423 of an Au/Sn eutectic alloy. The metallized films 422 are formed on upper and bottom surfaces of the polycrystalline diamond 421. Each of the metallized films 422 is formed by four layers of Ti, Mo, Ni and Au in this order on a side of the polycrystalline diamond 421. Either one of the upper and bottom surfaces, which are provided with the metallized films 422, of the polycrystalline diamond 421 is covered with the metallized film 423 of an Au/Sn eutectic alloy.

As to a monocrystalline diamond which is synthesized by high pressure synthesis, it is impossible to synthesize a material having dimensions of 20 mm by 20 mm with a thickness of 0.635 mm, by present technology. When upper and bottom surfaces of a material of 4 mm by 4 mm having a thickness of 0.635 mm were worked with a laser to be subjected to a cutting test, it was impossible to cut the same due to cracks formed in the cut portions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing diamond heat sinks made of a diamond synthesized by chemical vapor deposition, said diamond having a pair of main surfaces positioned opposite each other and electrically insulated from each other, said method comprising the following steps:

(a) preparing said diamond in the form of a polycrystalline diamond;
    (b) forming grooves in surfaces of said polycrystalline diamond;
    (c) forming a metallized film on at least one surface of said pair of main surfaces; and
    (d) mechanically dividing said polycrystalline diamond along said groove to form simultaneously a plurality of individual diamond heat sinks each having at least one solderable surface.

2. The method of claim 1, wherein said step of forming grooves is carried out with a YAG laser.

3. The method of claim 1, wherein said metallized film (12) is formed only on a portion of at least one of said main surfaces.

4. The method of claim 1, wherein aid step of forming said metallized film (12) includes first forming a first partial film (12a) on at least one of said pair of main surfaces, and then forming a second partial film (12b) on the surface of said first partial film.

5. The method of claim 4, wherein said first forming step produces said first partial film (12a) of at least one element selected from the group consisting of Ti, Cr, W and Ni, and wherein said second partial film (12b) is formed of at least one element selected from the group consisting of Pt, Pd, Ni, Mo, Au, Ag, Cu, Sn, In, Ge and Pb.

6. A method of manufacturing diamond heat sinks made of a diamond synthesized by chemical vapor deposition, said diamond having a pair of main surfaces positioned opposite each other and electrically insulated from each other, said method comprising the following steps:
   (a) preparing said diamond in the form of a polycrystalline diamond;
   (b) forming a metallized film on at least one surface of said pair of main surfaces;
   (c) forming grooves in surfaces of said polycrystalline diamond; and
   (d) mechanically dividing said polycrystalline diamond along said grooves to form simultaneously a plurality of individual diamond heat sinks each having at least one solderable surface.

7. The method of claim 6, wherein said step of forming grooves is carried out with a YAG laser.

8. The method of claim 6, wherein said metallized film (12) is formed only on a portion of at least one of said main surfaces.

9. The method of claim 6, wherein said step of forming said metallized film (12) includes first forming a first partial film (12a) on at least one of said pair of main surfaces, and then forming a second partial film (12b) on the surface of said first partial film.

10. The method of claim 9, wherein said first forming step produces said first partial film (12a) of at least one element selected from the group consisting of Ti, Cr, W and Ni, and wherein said second partial film (12b) is formed of at least one element selected from the group consisting of Pt, Pd, Ni, Mo, Au, Ag, Cu, Sn, In, Ge and Pb.

* * * * *

UNITED STATES PATENT AND TRADEMARK OFFICE
CERTIFICATE OF CORRECTION

PATENT NO. : 5,294,381

DATED : Mar. 15, 1994

INVENTOR(S) : Iguchi et al.

It is certified that error appears in the above-identified patent and that said Letters Patent is hereby corrected as shown below:

Col. 3, line 15, delete "graphite";
       line 46, replace "an attain" by --attain an--;
       line 53, replace "keeps" by --keep--;
       line 58, replace "$10^9$ Ω.cm." by --$10^9$ Ω·cm.--; delete ",";
       line 63, replace "5 W/cm.K" by --5 W/cm·K--;
       line 64, replace "W/cm.K" by --W/cm·K--;
       line 67, replace "20 W/cm.K" by --20 W/cm·K--;
       line 68, before "performance" insert --high--.

Col. 4, line 2, replace "5 W/cm.K" by --5 W/cm·K--;
       line 5, replace "5 W/cm.K" by --5 W/cm·K--;
       line 31, replace "a low contribute to" by --contribute to a low--;
       line 32, replace "solderbility." by --solderability.--;
       line 45, replace "rapture" by --rupture--;
       line 46, replace "rap-" by --rupture--;
       line 47, delete "ture";
       line 57, replace "mot." by --most.--.

Col. 5, line 34, before "described." insert --be--.

UNITED STATES PATENT AND TRADEMARK OFFICE
CERTIFICATE OF CORRECTION

PATENT NO. : 5,294,381

DATED : Mar. 15, 1994

INVENTOR(S) : Iguchi et al.

It is certified that error appears in the above-identified patent and that said Letters Patent is hereby corrected as shown below:

Col. 6, line 40, after "grooves" insert --will now be described with reference--;
      line 55, after "finished" insert --to--.

Col. 7, line 1, after "the" insert --grooves--;
      line 15, replace "$5 \times 10^9$ $\Omega.cm$," by --$5 \times 10^9$ $\Omega \cdot cm$,--, replace "15 w/cm.K" by --15 W/cm$\cdot$K--;
      line 42, after "finished" insert --to--;
      line 47, replace "2.1 mm," by --20.1 mm--;
      line 49, replace "botttom" by --bottom--.

Col. 8, line 7, replace "$\Omega.cm$" by --$\Omega \cdot cm$--, replace "10 W/cm.K" by --10 W/cm$\cdot$K--;
      line 27, delete ",";
      line 53, replace "groove" by --grooves--;
      line 61, replace "aid" by --said--.

Signed and Sealed this

Seventeenth Day of March, 1998

Attest:

BRUCE LEHMAN

*Attesting Officer*    *Commissioner of Patents and Trademarks*